(12) United States Patent
Lim et al.

(10) Patent No.: US 11,047,901 B2
(45) Date of Patent: Jun. 29, 2021

(54) METHOD OF TESTING AN INTERCONNECTION SUBSTRATE AND APPARATUS FOR PERFORMING THE SAME

(71) Applicant: SAMSUNG ELECTRONICS CO., LTD., Suwon-si (KR)

(72) Inventors: Mee-Hyun Lim, Seoul (KR); Sung-Yeol Kim, Yongin-si (KR); Seong-Keun Cho, Suwon-si (KR); Won-Don Joo, Incheon (KR); Jae-Hong Kim, Seoul (KR); Taek-Jin Kim, Suwon-si (KR); Kyung-Min Lee, Gwacheon-si (KR); Sang-Min Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 76 days.

(21) Appl. No.: 16/437,675

(22) Filed: Jun. 11, 2019

(65) Prior Publication Data

US 2020/0166563 A1 May 28, 2020

(30) Foreign Application Priority Data

Nov. 23, 2018 (KR) .......................... 10-2018-0146089

(51) Int. Cl.
*G01R 31/26* (2020.01)
*G01N 21/21* (2006.01)
(Continued)

(52) U.S. Cl.
CPC ....... *G01R 31/2607* (2013.01); *G01N 21/211* (2013.01); *G01R 1/071* (2013.01); *G01R 31/308* (2013.01)

(58) Field of Classification Search
CPC ...... G01R 31/2607; G01R 31/308–311; G01R 1/071; G01N 2021/212–218; G01N 21/23; G01N 21/211
See application file for complete search history.

(56) References Cited

U.S. PATENT DOCUMENTS

| 4,523,847 A * | 6/1985 | Bjorklund | G01J 3/4338 |
| | | | 356/364 |
| 4,795,260 A * | 1/1989 | Schuur | G01N 21/17 |
| | | | 356/400 |

(Continued)

FOREIGN PATENT DOCUMENTS

| JP | 2005-172730 A | 6/2005 |
| JP | 2006-126026 A | 5/2006 |

*Primary Examiner* — Patrick Assouad
*Assistant Examiner* — Demetrius R Pretlow
(74) *Attorney, Agent, or Firm* — Lee IP Law, P.C.

(57) ABSTRACT

In a method of testing an interconnection substrate, a blocking condition of a reference light reflected from a probe having an intrinsic optical characteristic may be set. An electric field emitted from a test interconnection substrate having a plurality of circuits may change the intrinsic optical characteristics of the probe into test optical characteristics. Light may be irradiated to the probe having the test optical characteristics. The reference light reflected from the probe having the test optical characteristic may be blocked in accordance with the blocking condition. The remaining reflected light that may be due to an abnormal circuit may be detected.

20 Claims, 11 Drawing Sheets

(51) Int. Cl.
*G01R 1/07* (2006.01)
*G01R 31/308* (2006.01)

(56) References Cited

U.S. PATENT DOCUMENTS

| | | | | |
|---|---|---|---|---|
| 5,093,874 A | * | 3/1992 | Hawkins | G02B 6/12004 |
| | | | | 385/14 |
| 5,548,404 A | * | 8/1996 | Kupershmidt | G01N 21/211 |
| | | | | 356/368 |
| 5,621,521 A | | 4/1997 | Takahashi | |
| 8,664,967 B2 | | 3/2014 | Hiroki | |
| 9,047,796 B2 | | 6/2015 | Hiroki et al. | |
| 9,719,946 B2 | | 8/2017 | Leem et al. | |
| 2001/0048527 A1 | * | 12/2001 | Takeuchi | G01J 4/00 |
| | | | | 356/369 |
| 2002/0030500 A1 | * | 3/2002 | Akikuni | G01R 31/311 |
| | | | | 324/754.23 |
| 2003/0094938 A1 | * | 5/2003 | Yanagisawa | G01N 21/95684 |
| | | | | 324/96 |
| 2004/0245439 A1 | * | 12/2004 | Shaver | G03F 7/70308 |
| | | | | 250/225 |
| 2005/0213100 A1 | * | 9/2005 | Murtagh | B82Y 20/00 |
| | | | | 356/432 |
| 2006/0094133 A1 | * | 5/2006 | Takeuchi | G01N 21/1717 |
| | | | | 438/14 |
| 2007/0018634 A1 | * | 1/2007 | Ohtake | G01R 31/311 |
| | | | | 324/96 |
| 2007/0020784 A1 | * | 1/2007 | Timans | H01L 21/67115 |
| | | | | 438/16 |
| 2007/0026594 A1 | * | 2/2007 | Takeuchi | G01N 21/31 |
| | | | | 438/197 |
| 2007/0046953 A1 | * | 3/2007 | De Groot | G03F 7/70625 |
| | | | | 356/512 |
| 2007/0229811 A1 | * | 10/2007 | Sanada | G01N 21/9501 |
| | | | | 356/237.2 |
| 2009/0033931 A1 | * | 2/2009 | Murtagh | G01N 21/1717 |
| | | | | 356/317 |
| 2010/0177313 A1 | * | 7/2010 | Jun | G02F 1/1309 |
| | | | | 356/366 |
| 2012/0126118 A1 | * | 5/2012 | Suzuki | H01J 37/026 |
| | | | | 250/310 |
| 2015/0002182 A1 | * | 1/2015 | Eiles | G01R 31/2656 |
| | | | | 324/762.01 |
| 2015/0241361 A1 | * | 8/2015 | Urano | G01N 21/9501 |
| | | | | 356/237.5 |
| 2016/0245743 A1 | * | 8/2016 | Mizubata | G01N 21/636 |
| 2016/0282427 A1 | * | 9/2016 | Heidmann | G11B 5/455 |
| 2017/0199116 A1 | * | 7/2017 | Yasuno | A61B 3/102 |
| 2018/0372776 A1 | * | 12/2018 | Zhang | G01Q 60/18 |
| 2019/0113565 A1 | | 4/2019 | Kim et al. | |
| 2019/0128823 A1 | * | 5/2019 | Berlatzky | G01N 21/956 |
| 2019/0137776 A1 | * | 5/2019 | Ryu | G01J 3/0208 |
| 2019/0140007 A1 | * | 5/2019 | Tsuchiya | H01L 27/14625 |

\* cited by examiner

METHOD OF TESTING AN INTERCONNECTION SUBSTRATE AND APPARATUS FOR PERFORMING THE SAME

CROSS-REFERENCE TO RELATED APPLICATION

Korean Patent Application No. 10-2018-0146089, filed on Nov. 23, 2018, in the Korean Intellectual Property Office, and entitled: "Method of Testing an Interconnection Substrate and Apparatus for Performing the Same," is incorporated by reference herein in its entirety.

BACKGROUND

1. Field

Example embodiments relate to a method of testing an interconnection substrate and an apparatus for performing the same. More particularly, example embodiments relate to a method of testing circuits in an interconnection substrate by a non-contact manner, and an apparatus for performing the method.

2. Description of the Related Art

A probe may be used for testing circuits in an interconnection substrate configured to electrically connect at least two semiconductor chips with each other. The probe may be classified into a contact type probe that directly may contact the circuits and a non-contact type probe that may not make contact with the circuits.

According to related arts, the non-contact type probe may use an ellipsometry. However, the ellipsometry may not be able to determine whether multi-layered circuits in an opaque substrate may be normal or not. In this case, the multi-layered circuits may be tested using an additional non-contact type probe. However, an image of the interconnection substrate obtained using the additional non-contact type probe may be of low quality. Thus, the circuits may not be accurately tested using the image of the interconnection substrate.

SUMMARY

According to example embodiments, there may be provided a method of testing an interconnection substrate. In the method of testing the interconnection substrate, a blocking condition of a reference light reflected from a probe having intrinsic optical characteristics may be set. An electric field emitted from the interconnection substrate having a plurality of circuits may be applied to the probe to change the intrinsic optical characteristics of the probe into test optical characteristics. Light may be irradiated to the probe having the test optical characteristic. The reference light in reflected light from the probe having the test optical characteristic may be blocked in accordance with the blocking condition. Remaining reflected light may be detected.

According to example embodiments, there may be provided a method of testing an interconnection substrate. In the method of testing the interconnection substrate, a light may be linearly polarized to form a first polarized light. A phase difference may be provided to the first polarized light to form a second polarized light. The second polarized light may be irradiated to a probe having test optical characteristics. A reference light reflected from the probe having the test optical characteristic may be detected. A blocking condition of the reference light may be set. The light may be linearly polarized to form the first polarized light. The phase difference may be provided to the first polarized light to form the second polarized light. The second polarized light may be irradiated to the probe having the actual optical characteristic. The reference light in reflected light from the probe having the test optical characteristic may be blocked in accordance with the blocking condition. Remaining reflected light may be detected.

According to example embodiments, there may be provided an apparatus for testing an interconnection substrate. The apparatus may include an electric field generator, a probe, a light source, a linear polarizer, a compensator, an analyzer, a light detector, and a controller. The electric field generator may induce an emission of an electric field from the interconnection substrate having a plurality of circuits. The probe may be arranged adjacent to the interconnection substrate. The probe may have intrinsic optical characteristics changed by the electric field into test optical characteristics. The light source may generate a light. The linear polarizer may linearly polarize the light to form a first polarized light. The compensator may provide the first polarized light with a phase difference to form a second polarized light that is incident to the probe. The analyzer may transmit polarized light having a specific direction among reflected light from the probe. The light detector may detect the polarized light passing through the analyzer. The controller may analyze the polarized light detected by the light detector to determine whether the plurality of circuits may be normal or not. The controller may set a blocking condition of a reference light reflected from the probe having intrinsic optical characteristics.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, example embodiments will be explained in detail with reference to the accompanying drawings.

Apparatus for Testing an Interconnection Substrate

Figure 1:
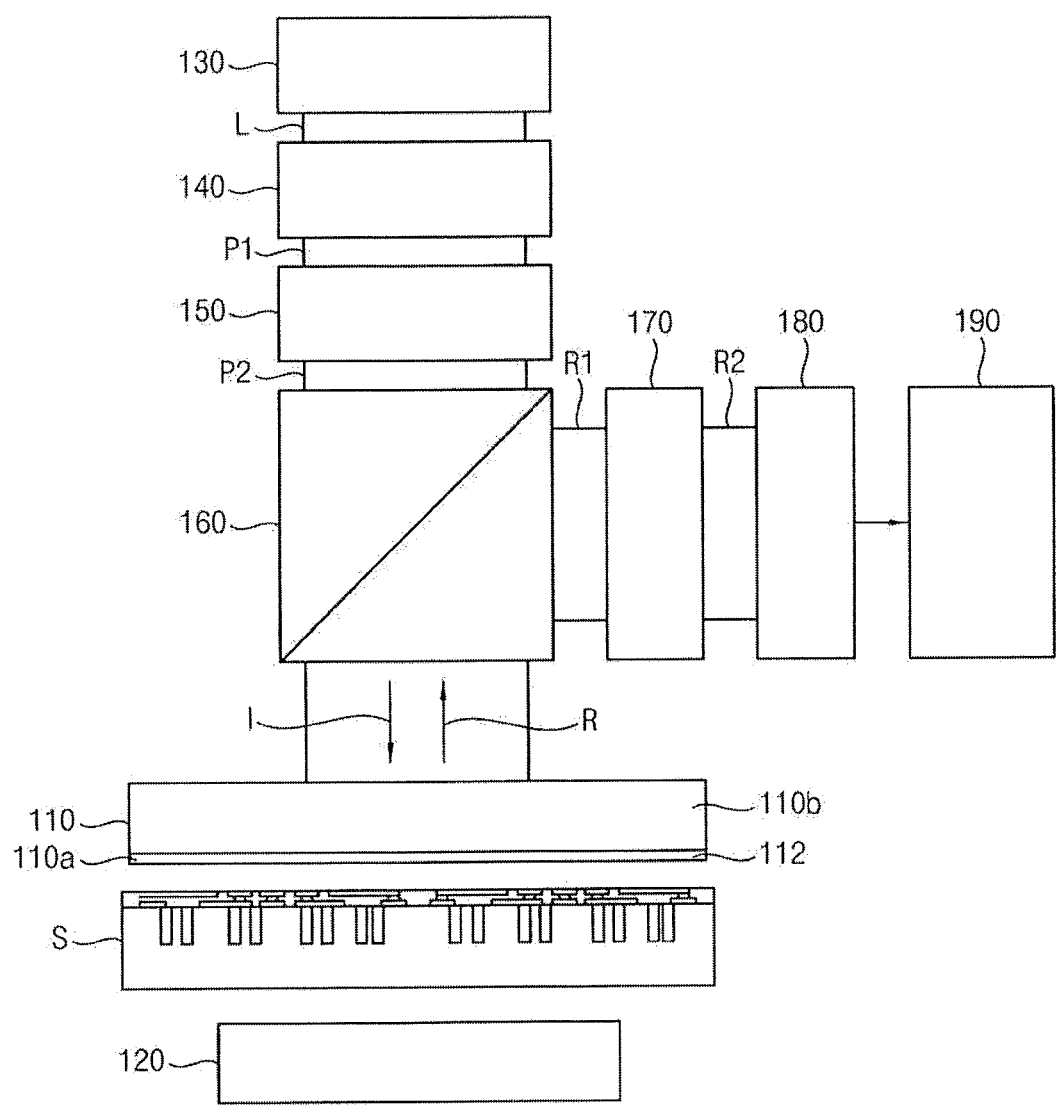
FIG. 1 illustrates an apparatus for testing an interconnection substrate in accordance with example embodiments.
Figure 2:
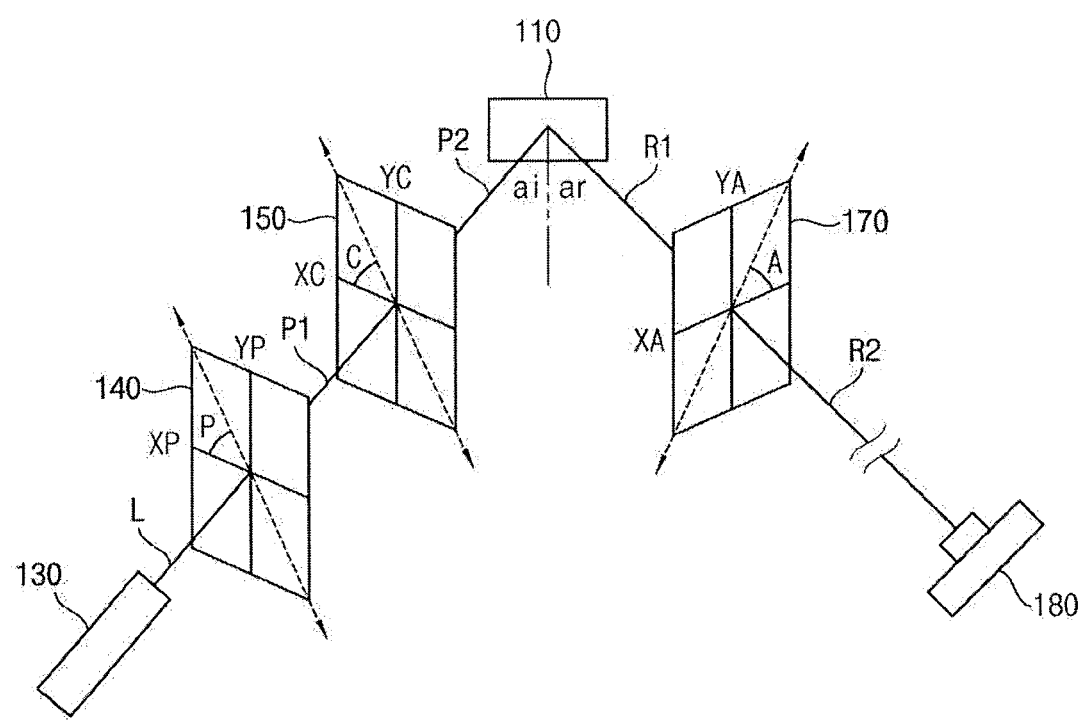
FIG. 2 illustrates a process for processing a light by the apparatus in FIG. 1.

FIG. 1 illustrates a block diagram an apparatus for testing an interconnection substrate in accordance with example embodiments. FIG. 2 illustrates a process for processing a light by the apparatus in FIG. 1.

Referring to FIG. 1, an apparatus for testing an interconnection substrate in accordance with example embodiments may include a probe 110, an electric field generator 120, a light source 130, a linear polarizer 140, a compensator 150, a beam splitter 160, an analyzer 170, a light detector 180, and a controller 190.

The interconnection substrate S may include a substrate, a plurality of circuits, and an insulation layer. The circuits may include an internal wiring, a pad, a connection terminal, etc., formed in the substrate. The substrate may include silicon, an organic material, a plastic, a glass, etc. The internal wiring may have a single layer or a multi-layer. The internal wiring may have a horizontal and/or vertical connection structure. The connection terminal may be arranged on a lower surface of the interconnection substrate S. The connection terminal may be electrically connected with the pad. The pad may be arranged on an upper surface of the interconnection substrate S. The pad may be electrically connected with the internal wiring. The insulation layer may include a carrier substrate or a supporting substrate for handling the thin interconnection substrate S.

The probe 110 may be arranged over the interconnection substrate S. The probe 110 may be positioned adjacent to the interconnection substrate S. The probe 110 may include a probing substrate 110a having intrinsic optical characteristics transmitting light therethrough. The probing substrate 110a may be attached to a supporting substrate 110b for supporting the probing substrate 110a. The probe 110 may include a reflective layer 112. The reflective layer 112 may be arranged on a lower surface of the probing substrate 110a, i.e., a surface facing the interconnection substrate. Thus, the light downwardly incident onto the probing substrate 110a may be upwardly reflected from the reflective layer 112.

The electric field generator 120 may be under the interconnection substrate S. The electric field generator 120 may include a printed circuit board, an antenna, and the like. The electric field generator 120 may apply an electric field to the interconnection substrate S. Thus, the electric field may be emitted from the interconnection substrate S. The electric field emitted from the interconnection substrate S may change optical characteristics of the probe 110. For example, the electric field applied to the interconnection substrate S from the electric field generator 120 may be distorted by an abnormal internal wiring. The distorted electric field may be transmitted to the pad and/or the connection terminal. The distorted electric field may include information of the abnormal internal wiring. Thus, the optical characteristic of the probe 110 changed by the electric field may also include the information of the abnormal internal wiring.

The light source 130 may be arranged over the probe 110. The light source 130 may irradiate a light L in a vertical direction toward an upper surface of the probe 110, i.e., light is incident orthogonal to the upper surface of the probe. The light source 130 may include a broadband light source, a multi-wavelength light source, a wavelength-tunable light source, a single wavelength light source, or the like.

The linear polarizer 140 may be between the light source 130 and the probe 110. The linear polarizer 140 may linearly polarize the light L emitted from the light source 130 to form a first polarized light P1. For example, the linear polarizer 140 may allow a P-polarized light, i.e., a horizontal component, or an S-polarized light, i.e., a vertical component in the light L to be transmitted there through to form the first polarized light P1.

The compensator 150 may be between the linear polarizer 140 and the probe 110. The compensator 150 may polarize the first polarized light P1 to form a second polarized light P2. The second polarized light P2 may have be circular or elliptical polarized light. For example, the compensator 150 may provide the first polarized light P1 with a phase difference to change the linear first polarized light P into the circular or elliptical second polarized light P2. Thus, the compensator 150 may include a phase retarder, e.g., a quarter-wave plate.

The beam splitter 160 may be arranged between the compensator 150 and the probe 110. The second polarized light P2 incident to the beam splitter 160 may be split into transmitted light and reflected light. The transmitted light or the reflected light (hereinafter, referred to as an incident light I) split by the beam splitter 160 may be incident onto the probe 110. The beam splitter 160 may include a non-polarizing beam splitter or a polarizing beam splitter. The beam from the beam splitter 160 may have substantially the same intensity or different intensities, e.g., integer multiples of each other.

The incident light I may be reflected from the probe 110. Particularly, the incident light I may be reflected from the reflective layer 112. Thus, the incident light I may not be incident on the electric field generator 120 or the substrate S. As mentioned above, reflected light R from the probe 110 may include the information about the circuits in the interconnection substrate S. For example, the reflected light R reflected from a portion of the probe 110 corresponding to a normal circuit on the interconnection substrate S (hereinafter, referred to as reference light) may have a polarization direction different from that of reflected light R reflected from a portion of the probe 110 when there is an abnormal circuit on the interconnection substrate S.

The reflected light R from the probe 110 may be split by the beam splitter 160. A reflected light R1 reflected from the beam splitter 160 or transmitted through the beam splitter 160 may be incident to the analyzer 170 through a path different from that of the incident light I.

The reflected light R1 from the beam splitter 160 may be incident to the analyzer 170. The analyzer 170 may include a linear polarizer for allowing a polarized light having a specific direction among the reflected light R1 from the probe 110 to pass therethrough. In example embodiments, the analyzer 170 may block the reference light among the reflected light R1 from the probe 110. In contrast, the analyzer 170 may allow a remainder of the reflected light R1 to pass therethrough as reflected light R2. Because the rest of the reflected light R2 may be due to the abnormal circuit, the remainder of the reflected light R2 may have a polarization direction different from that of the reference light. Thus, the reflected light R2 passing through the analyzer 170n may include information only regarding the abnormal circuit.

The light detector 180 may detect the reflected light R2 passing through the analyzer 170. The light detector 180 may output a two-dimensional image of the detected reflected light R2. The light detector 180 may include an electron multiplying charge-coupled device (EMCCD) camera, a scientific complementary metal-oxide-semiconductor (sCMOS) camera, and the like.

The controller 190 may control operations of the test apparatus. Particularly, the controller 190 may analyze the reflected light R2 detected by the light detector 180 to determine whether the circuits on the interconnection substrate S are normal, e.g., not defective, or not, e.g., defective. For example, the controller 190 may compare the images of the circuits with an image of a reference or normal circuit having circuits with no defects to determine whether the circuits are normal or not. Further, the controller 190 may set a blocking condition of the reference light in the analyzer 170.

Hereinafter, a method of setting the blocking condition of the reference light by the controller 190 may be illustrated with reference to FIG. 2.

The probe 110 may have intrinsic optical characteristics. The light L emitted from the light source 130 may be incident to the probe 110 through the linear polarizer 140 and the compensator 150. The analyzer 170 may detect the light reflected from the probe 110, i.e., the reference light.

Rotated angles of the linear polarizer 140, the compensator 150 and the analyzer 170 with respect to an optical axis, i.e., azimuths of the linear polarizer 140, the compensator 150 and the analyzer 170 may be P, C and A, respectively. E(P,C,A) is a complex amplitude of the reference light passing through the analyzer 170 may be represented by a following Formula 1.

$$E(P,C,A)=r_p \cdot \cos A[\cos(P-C)\cdot\cos C + i\cdot\sin C\cdot\sin(C-P)] + r_s\cdot\sin A[\cos(P-C)\cdot\sin C - i\cdot\cos C\cdot\sin(C-P)] \quad \text{Formula 1}$$

In Formula 1, $r_p$ represents a reflection coefficient of the probe 110 with respect to the P-polarized light and $r_s$ represents a reflection coefficient of the probe 110 with respect to the S-polarized light.

The $r_p$ and the $r_s$ may be represented by a following Formula 2.

$$\tan\psi \cdot e^{i\Delta} = r_p/r_s \quad \text{Formula 2}$$

In Formula 2, the $\psi$ and the $\Delta$ are parameters of the elliptically polarized light.

I(P,C,A) is an intensity of the light detected by the light detector 180 and at least three different values may be applied to P, C and A to obtain at least three I(P,C,A).

I(P,C,A) and E(P,C,) may be represented by a following Formula 3.

$$I(P,C,A)=|E(P,C,A)|^2 \quad \text{Formula 3}$$

For example, when the at least three I(P,C,A) may be $I_1(0,\pi/4,0)$, $I_2(0,\pi/4,\pi/4)$ and $I_3(\pi/4,\pi/4,\pi/2)$, the $\tan\psi$ and the $\sin\Delta$ may be represented by following Formulae 4 and 5.

$$\tan\psi = (I_1/I_3)^{1/2} \quad \text{Formula 4}$$

$$\sin\Delta = (I_1+I_3-2I_2)/(4I_1\cdot I_3)^{1/2} \quad \text{Formula 5}$$

The $\psi$ and the $\Delta$ may be obtained from Formulae 4 and 5. Alternatively, the $\psi$ and the $\Delta$ may be obtained by at least three measuring other combinations as well as the above-mentioned combination of P, C and A. In order to obtain the more accurate $\psi$ and the more accurate $\Delta$, measurements by at least four combinations of P, C and A may be performed.

After obtaining the $\psi$ and the $\Delta$, the blocking condition of the reference light for blocking the reference light through the analyzer 170 may be obtained as follows. When C is $\pi/4$, Formula 1 may be represented by a following Formula 6

$$E(P,C,A)=r_s/\sqrt{2}\cdot\cos A\cdot e^{-i(\pi/4-P)}[r_p/r_s\cdot e^{(i\pi/2-2P)}+\tan A] \quad \text{Formula 6}$$

A=$\psi$ and P=$\Delta/2-\pi/4$ may be obtained by Formula 2 under a condition that E(P,$\pi/4$,A) is zero. Because the $\psi$ and the $\Delta$ may be obtained, A and P may be calculated. Thus, C=$\pi/4$, A=$\psi$ and P=$\Delta/2-\pi/4$ as the blocking condition of the reference light may be obtained. Alternatively, C may be other values as well as $\pi/4$.

Figure 3:
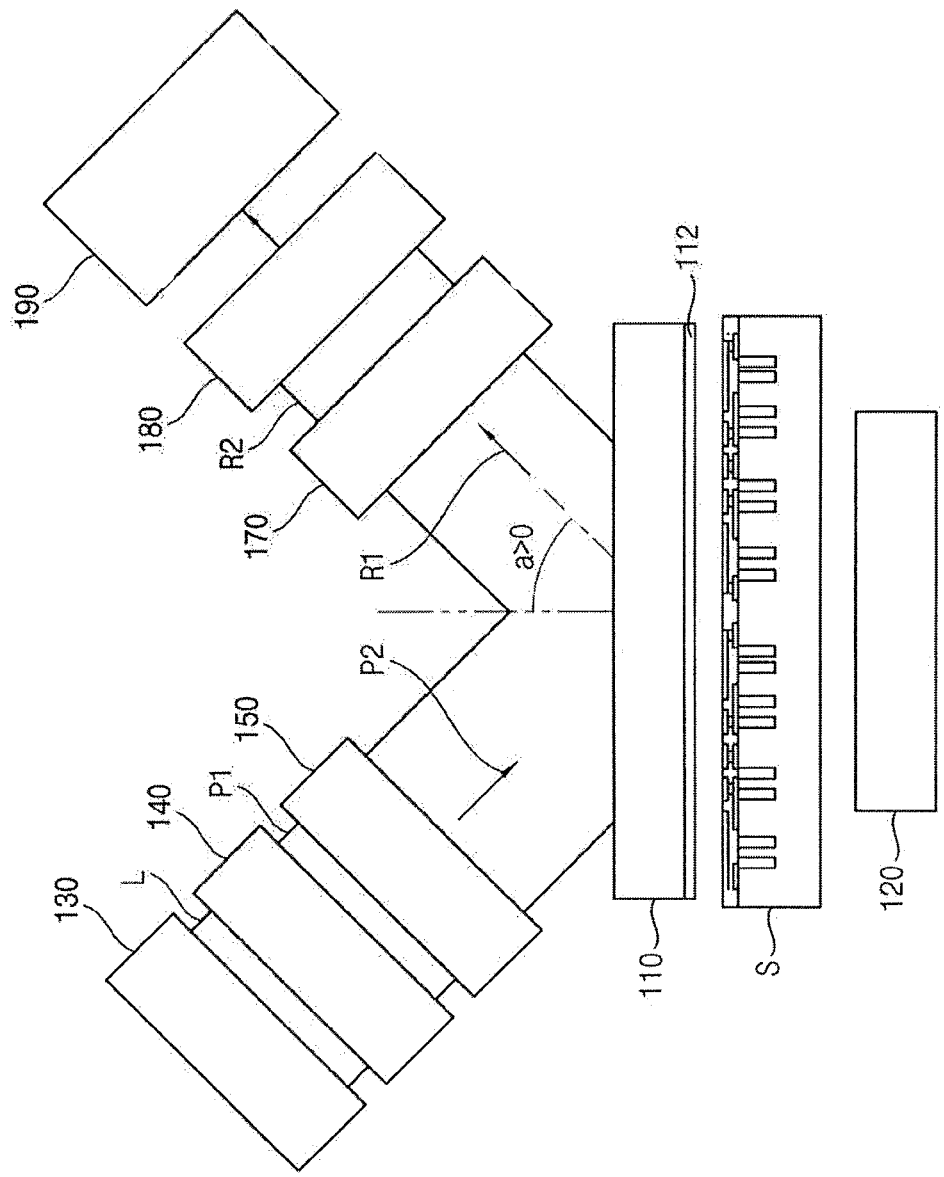
FIG. 3 illustrates an apparatus for testing an interconnection substrate in accordance with example embodiments.

FIG. 3 illustrates an apparatus for testing an interconnection substrate in accordance with example embodiments.

Referring to FIG. 3, an apparatus for testing an interconnection substrate in accordance with example embodiments may include a probe 110, an electric field generator 120, a light source 130, a linear polarizer 140, a compensator 150, an analyzer 170, a light detector 180 and a controller 190 that function substantially the same as those of FIG. 1. Thus, any further description with respect thereto may be omitted herein for brevity.

The light source 130, the linear polarizer 140 and the compensator 150 may be arranged at an angle over the probe 110, e.g., light is not incident orthogonally on the upper surface of the probe 110. The analyzer 170 and the light detector 180 may also be slantly arranged over the probe 110. Thus, the second polarized light P2 formed by the compensator 150 may be incident to the probe 110 at an angle. Further, the reflected light R reflected from the probe 110 at an angle to be incident to the analyzer 170.

Method of Testing an Interconnection Substrate

Figure 4:
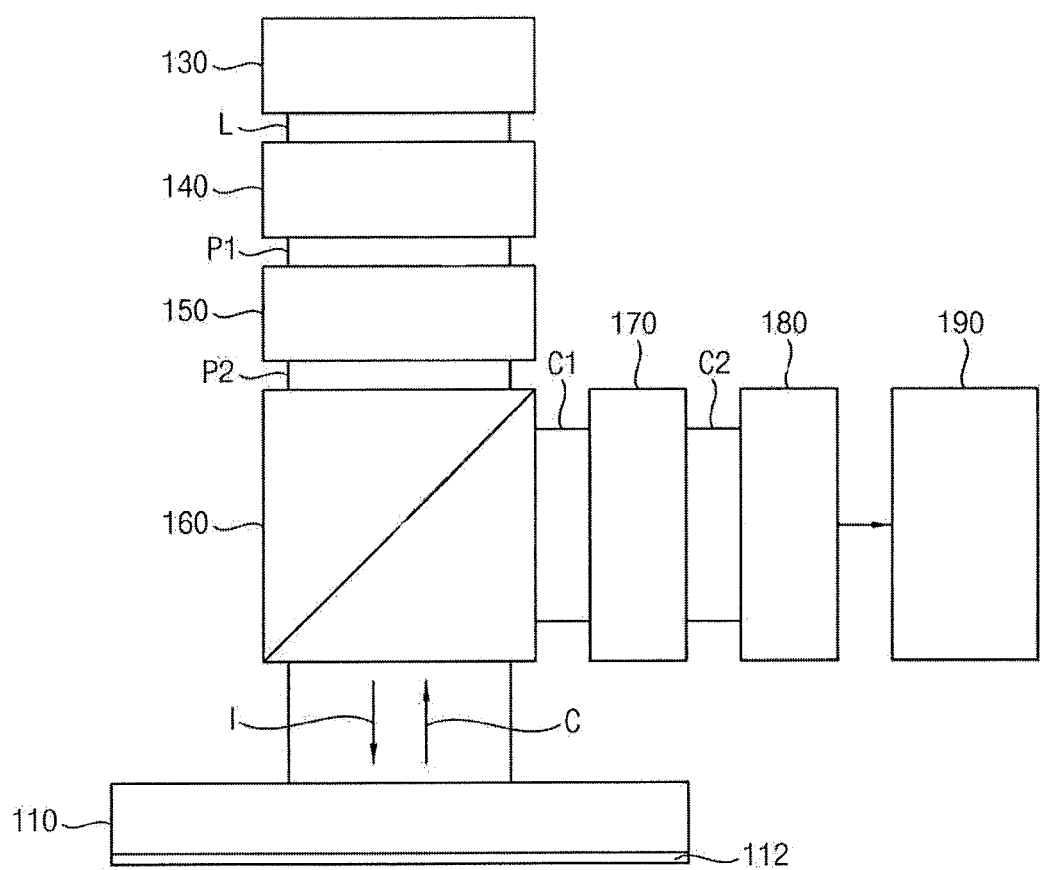
FIGS. 4 to 6 illustrate a method of testing an interconnection substrate using the apparatus in FIG. 1.
Figure 5:
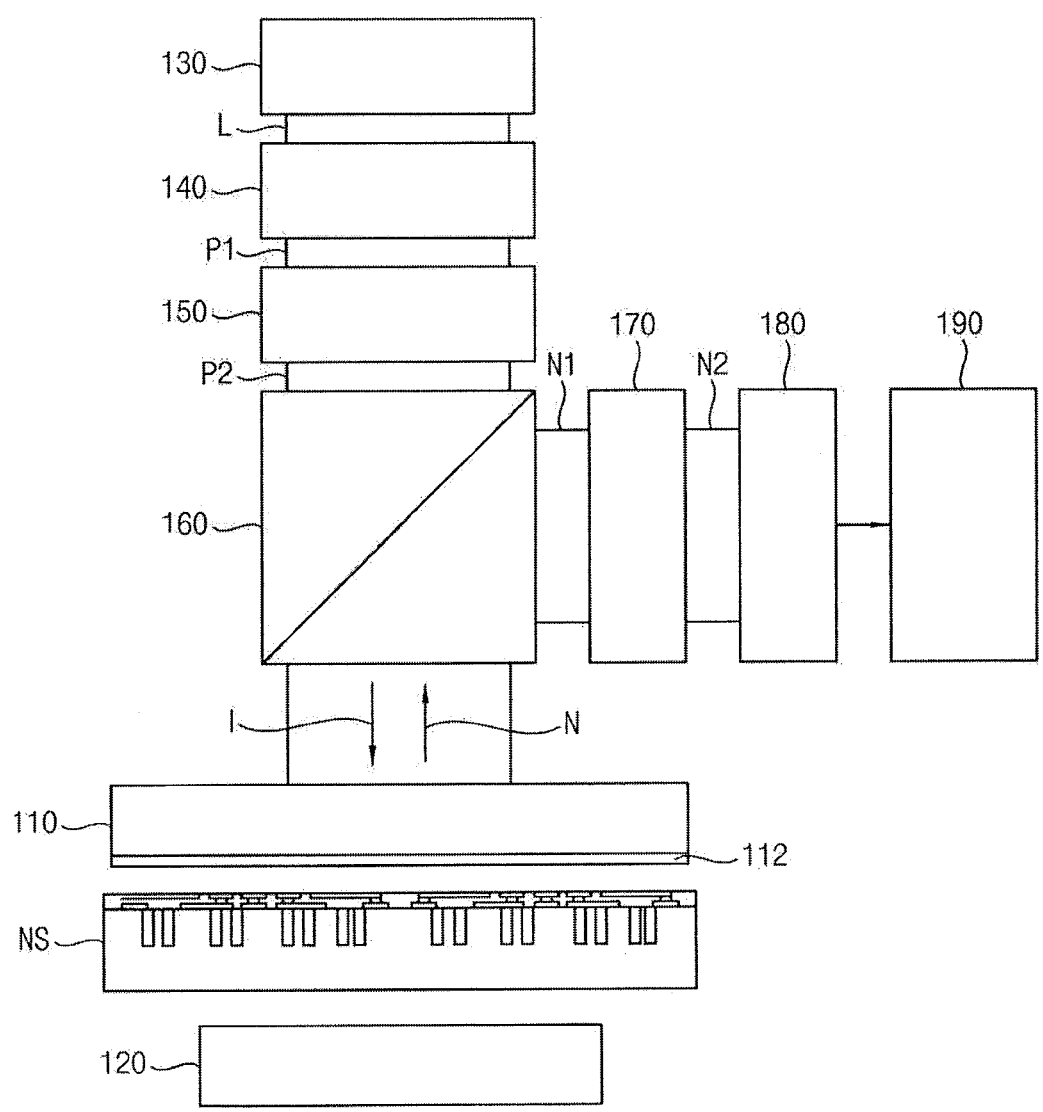
Figure 6:
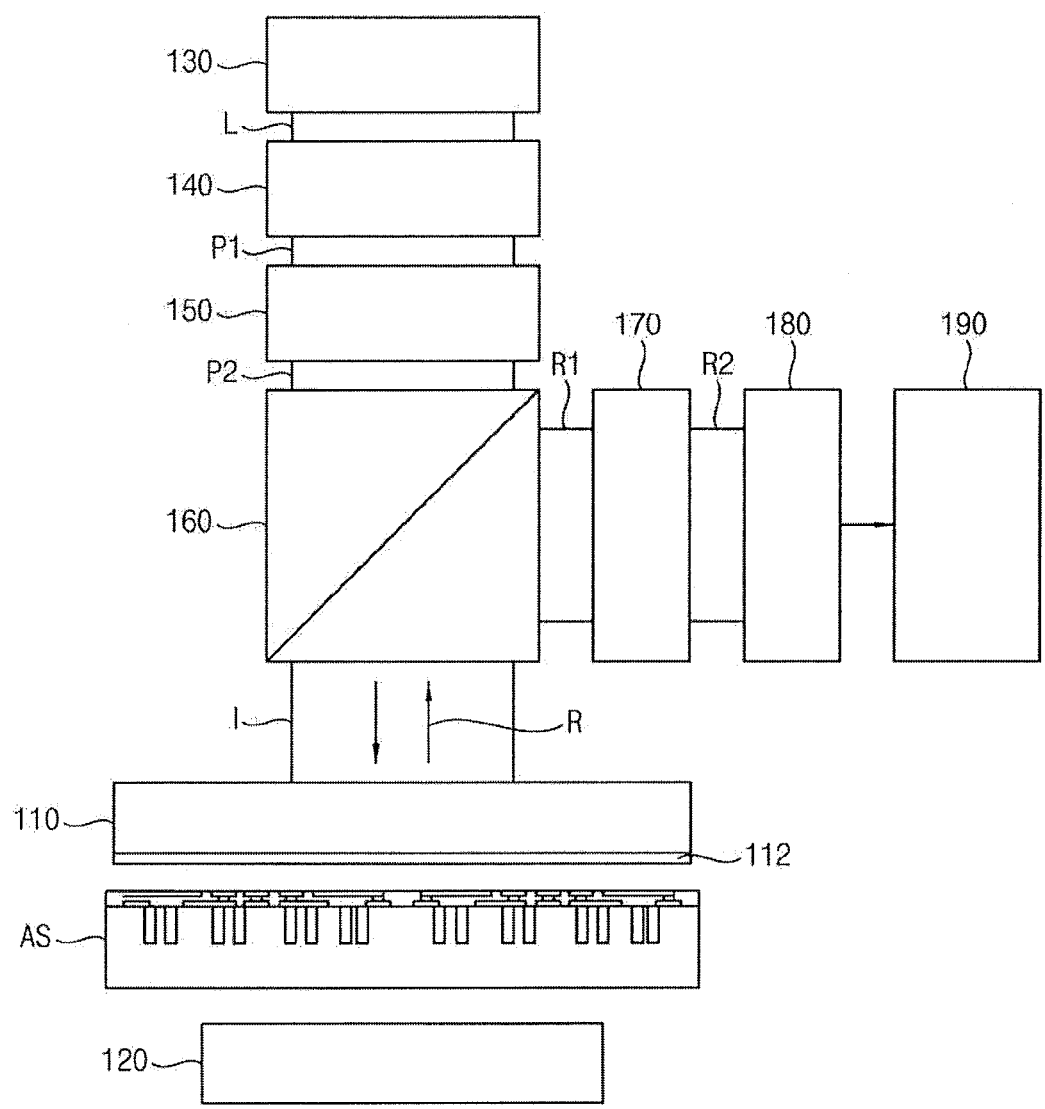
Figure 7:
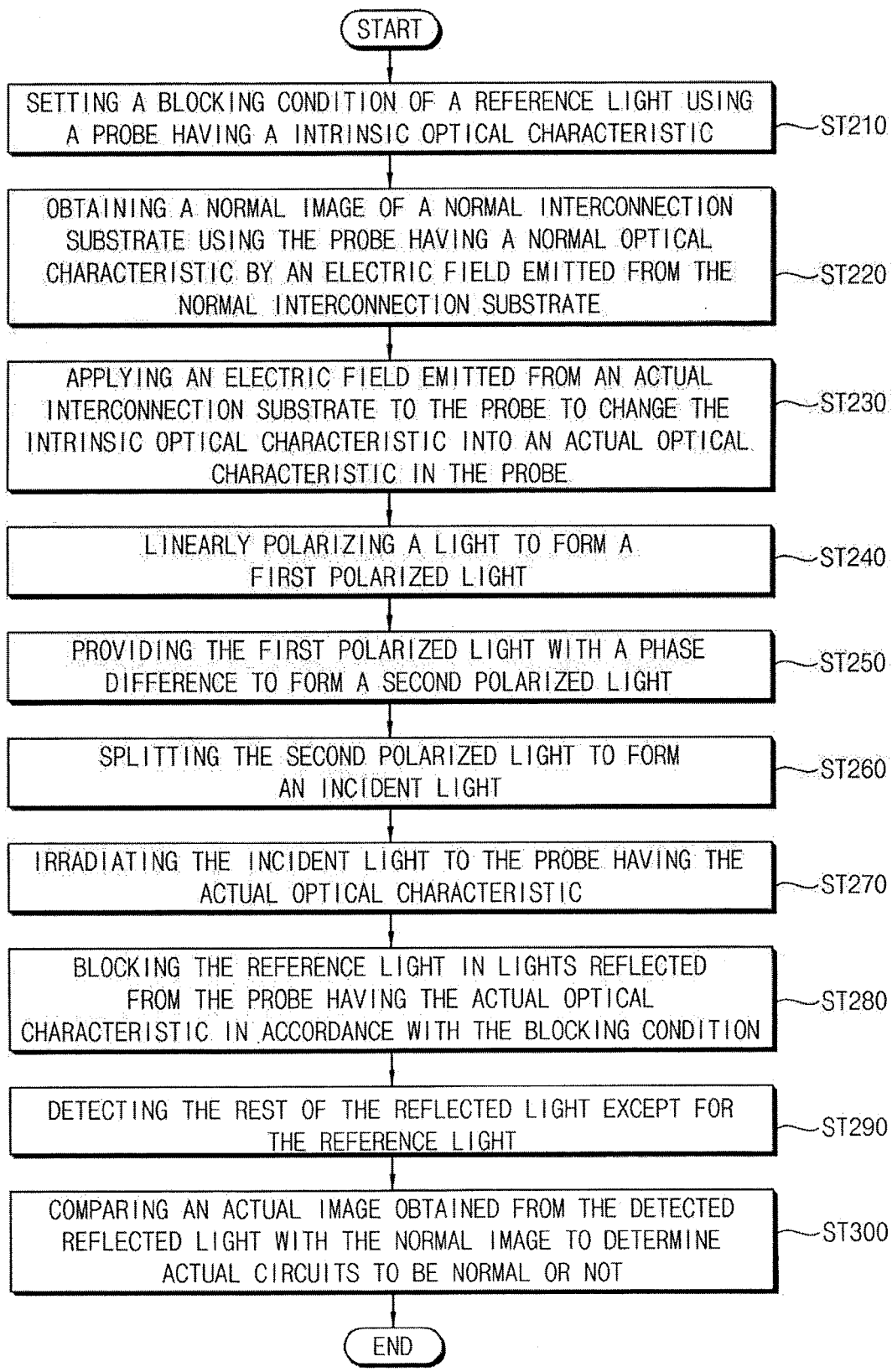
FIG. 7 illustrates a flow chart of the method in FIGS. 4 to 6.

FIGS. 4 to 6 illustrate a method of testing an interconnection substrate using the apparatus in FIG. 1. FIG. 7 is a flowchart illustrating the method in FIGS. 4 to 6.

Referring to FIGS. 4 and 7, in ST210, the blocking condition of the reference light may be set using the probe 110 intrinsic optical characteristics. Particularly, the interconnection substrate and the electric field generator 120 may not be arranged under the probe 110. In this condition, the light L emitted from the light source 130 may be incident to the linear polarizer 140. The linear polarizer 140 may linearly polarize the light L to form the first polarized light P1. The first polarized light P1 may then be incident to the compensator 150. The compensator 150 may provide the first polarized light P1 with the phase difference to form the circular or elliptical second polarized light P2. The second polarized light P2 may then be incident to the beam splitter 160. The second polarized light P2 incident to the beam splitter 160 may be split into the transmitted light and the reflected light to form the incident light I.

The incident light I may be incident to the probe 110 having the intrinsic optical characteristic. The reference light C may be reflected from the probe 110 having the intrinsic optical characteristic. The reference light C reflected from the probe 110 may be split by the beam splitter 160. A reference light C1 reflected from the beam splitter 160 may be incident to the analyzer 170. A reference light C2 passing through the analyzer 170 may be incident to the light detector 180. The light detector 180 may detect the reference light C2. The controller 190 may set the blocking condition of the reference light C2 for blocking the reference light C2 through the analyzer 170 using the method illustrated with reference to Formulae.

Referring to FIGS. 5 and 7, in ST220, a normal image of a normal interconnection substrate NS, i.e., an interconnection substrate without defects, may be obtained using the probe 110. Particularly, the normal interconnection substrate NS having normal circuits may be between the probe 110 and the electric field generator 120. The electric field generator 120 may apply the electric field to the normal interconnection substrate NS. The intrinsic optical characteristic of the probe 110 may be changed into a reference optical characteristic of the probe 110 by the electric field. The reference optical characteristic of the probe 110 may include information of the normal circuits in the normal interconnection substrate NS.

In this condition, a light L emitted from the light source 130 may be incident to the linear polarizer 140. The light L may have characteristics substantially the same as those of the light L incident to the probe 110 having the intrinsic optical characteristic. The linear polarizer 140 may linearly polarize the light L to form the first polarized light P1. The first polarized light P1 may then be incident to the compensator 150. The compensator 150 may provide the first polarized light P1 with the phase difference to form the circular or elliptical second polarized light P2. The second polarized light P2 may then be incident to the beam splitter 160. The second polarized light P2 incident to the beam splitter 160 may be split into the transmitted light and the reflected light to form the incident light I.

The incident light I may be incident to the probe 110 having the normal optical characteristic. The reflected light N may be reflected from the probe 110 having the normal optical characteristic. The reflected light N from the probe 110 may be split by the beam splitter 160. A reflected light N1 reflected from the beam splitter 160 may be incident to the analyzer 170. A reflected light N2 passing through the analyzer 170 may be incident to the light detector 180. The light detector 180 may detect the reflected light N2. The light detector 180 may output normal images of the normal circuits from the reflected light N2. The normal images may then be stored in the controller 190.

Referring to FIGS. 6 and 7, in ST230, an actual interconnection substrate AS, i.e., an interconnection substrate to be tested, having actual circuits may be between the probe 110 and the electric field generator 120. The electric field generator 120 may apply the electric field to the actual interconnection substrate AS. Thus, the electric field may be emitted from the actual interconnection substrate AS. The intrinsic optical characteristic of the probe 110 may be changed into a test optical characteristic of the probe 110 when the electric field may be applied to the actual interconnection substrate. The test optical characteristic of the probe 110 may include information of the actual circuits in the actual interconnection substrate AS. That is, the test optical characteristic of the probe 110 may include the information of normal circuits and abnormal circuits in the actual interconnection substrate AS. Particularly, the reflected light reflected from a portion of the probe 110 having the test optical characteristics that may include information of the normal circuits may correspond to the reference light, while remaining light may correspond to test light.

In this condition, a light L emitted from the light source 130 may be incident to the linear polarizer 140. The light L may have characteristics substantially the same as those of the light L incident to the probe 110 having the intrinsic optical characteristic.

In ST240, the linear polarizer 140 may linearly polarize the light L to form the first polarized light P1. The first polarized light P1 may then be incident to the compensator 150.

In ST250, the compensator 150 may provide the first polarized light P1 with the phase difference to form the circular or elliptical second polarized light P2. The second polarized light P2 may then be incident to the beam splitter 160.

In ST260, the second polarized light P2 incident to the beam splitter 160 may be split into the transmitted light and the reflected light to form the incident light I.

In ST270, the incident light I may be incident to the probe 110 having the test optical characteristic. The reflected light R may be reflected from the probe 110 having the test optical characteristic.

In ST280, the reflected light R from the probe 110 may be split by the beam splitter 160. A reflected light R1 reflected from the beam splitter 160 may be incident to the analyzer 170. The reflected light R1 may include the reference light. As mentioned above, the controller 190 may set the blocking condition of the reference light in the analyzer 170. Thus, the reference light in the reflected light R1 may not pass through the analyzer 170. In contrast, a remainder of the reflected light R1 may pass through the analyzer 170 as reflected light R2. Here, the reflected light R2 may correspond to a light reflected from a portion of the probe 110 having the test optical characteristic that may include the information of the abnormal circuits.

In ST290, the reflected light R2 may be incident to the light detector 180. The light detector 180 may detect the reflected light R2. The light detector 180 may output test images of the abnormal circuits from the reflected light R2. The test images may then be stored in the controller 190.

In ST300, the controller 190 may compare the test image with the normal image to determine whether the actual circuits in the actual interconnection substrate AS are normal or not.

Figure 8:
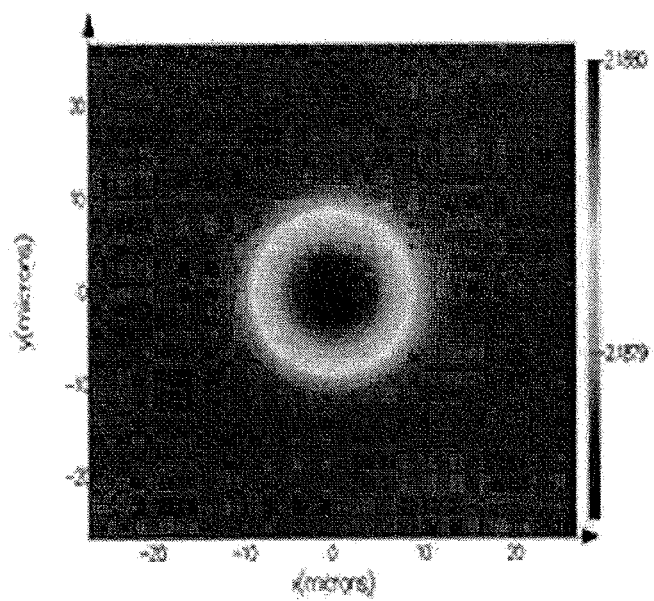
FIGS. 8 to 10 illustrate images reflected from a probe using the method of example embodiments and a comparative method.
Figure 9:
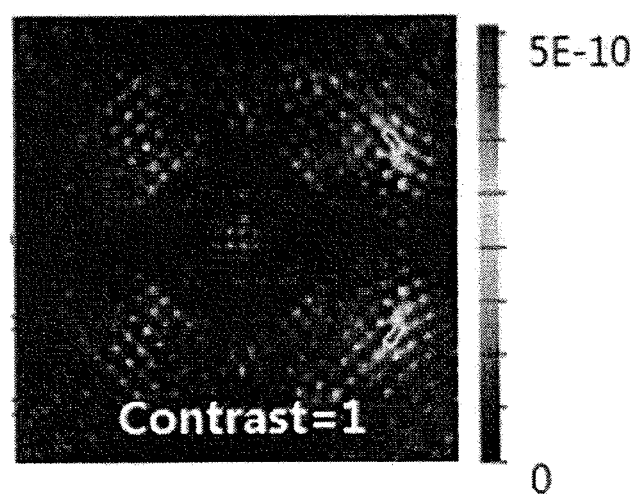
Figure 10:
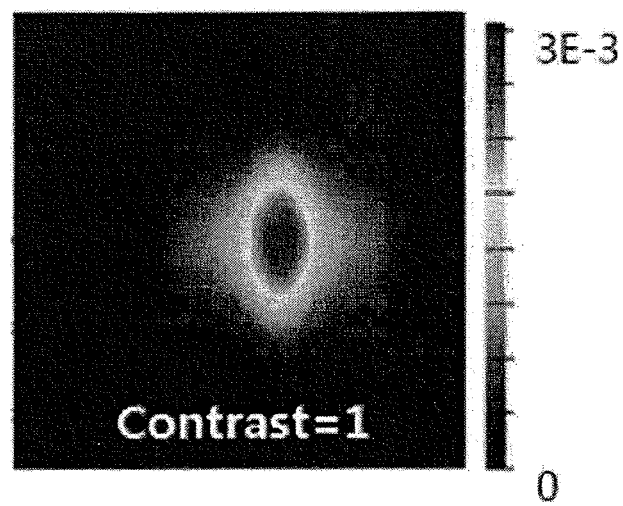

FIGS. 8 to 10 are images reflected from a probe facing a test interconnection substrate using the method of example embodiments and a comparative method. FIG. 8 shows the image reflected from the probe, FIG. 9 shows the image reflected from the probe by the electric field intensity without the blocking condition of the reference light, and FIG. 10 shows the image reflected from the probe by the electric field intensity with the blocking condition of the reference light.

As shown in FIGS. 8 and 9, the image in FIG. 9 when the blocking condition may not be applied may be greatly distorted compared than the image in FIG. 8. In contrast, the image in FIG. 10 obtained under the condition that the blocking condition of the reference light may be applied may be substantially similar to the image in FIG. 8. Therefore, the abnormal circuit of the actual interconnection substrate may be accurately detected by applying the blocking condition of the reference light.

Figure 11:
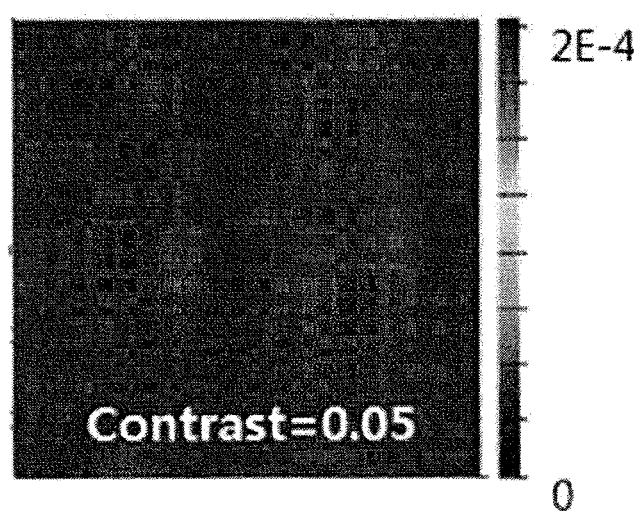
FIGS. 11 and 12 illustrate images reflected from a probe using the comparative method when an analyzer is misaligned.
Figure 12:
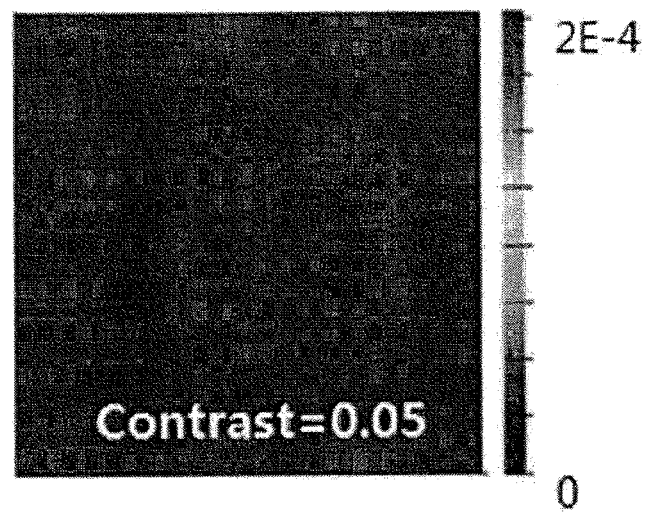

FIGS. 11 and 12 are images reflected from a probe using the comparative method when there is an alignment error of an analyzer. FIG. 11 shows the reflected image from the probe without the blocking condition of the reference light when an error of about +1° with respect to a rotation angle of the analyzer may be generated. FIG. 12 shows the reflected image from the probe without the blocking condition of the reference light when an error of about −1° with respect to a rotation angle of the analyzer is generated. As shown in FIGS. 11 and 12, when the rotation angle of the analyzer has an error of about ±1°, contrast of the images obtained without using the blocking condition of the reference light may be reduced from about 1 in FIG. 9 to about 0.05, e.g., by about 95%.

Figure 13:
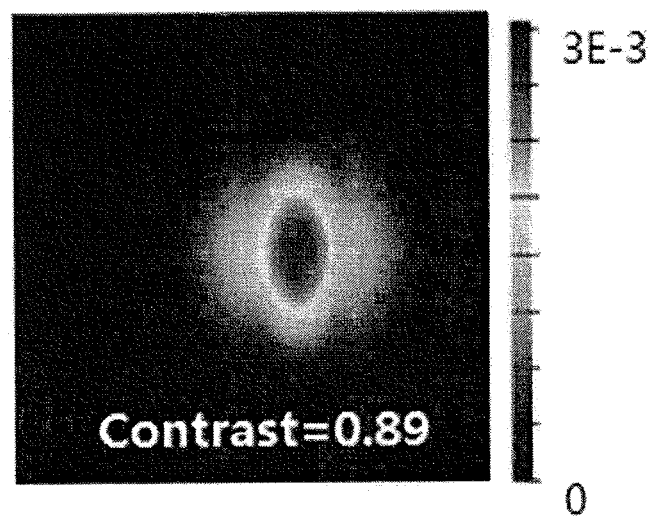
FIGS. 13 and 14 illustrate images reflected from a probe using the method of example embodiments when an analyzer is misaligned.
Figure 14:
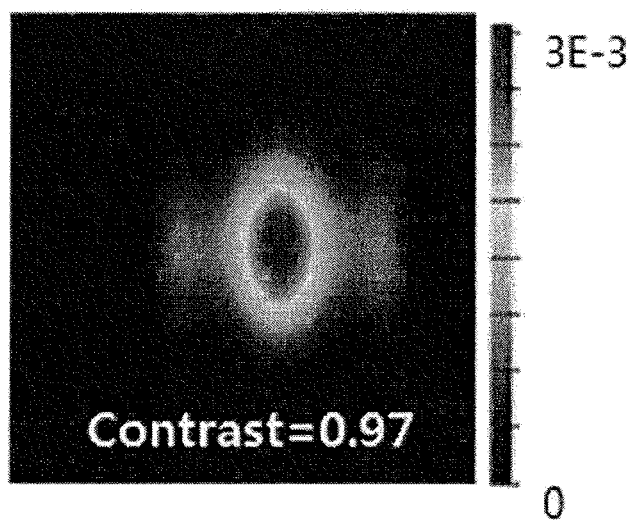

FIGS. 13 and 14 are images reflected from of a probe using the method of example embodiments in accordance with an alignment error of an analyzer. FIG. 13 shows the reflected image from the probe with the blocking condition of the reference light when an error of about +1° with respect to a rotation angle of the analyzer may be generated, and FIG. 14 shows the reflected image from the probe with the blocking condition of the reference light when an error of about −1° with respect to a rotation angle of the analyzer may be generated.

As shown in FIGS. 13 and 14, when the rotation angle of the analyzer may have the error of about ±1°, a contrast of the images obtained under the condition that the blocking condition of the reference light may be applied may be reduced from about 1 in FIG. 10 to about 0.89 or about 0.97, e.g., by about 11% or about 3%. Thus, the blocking condition of the reference light may reduce sensitivity of an error in setting a test condition of the interconnection substrate.

According to example embodiments, the blocking condition of the reference light may be set using the probe having the intrinsic optical characteristic. The reference light in the reflected lights from the probe having the test optical characteristic may be blocked in accordance with the blocking condition. Thus, a remainder of the reflected light may be caused by an abnormal circuit so that the abnormal circuit in the interconnection substrate may be accurately detected.

Embodiments are described, and illustrated in the drawings, in terms of functional blocks, units, modules, and/or methods. Those skilled in the art will appreciate that these blocks, units, modules, and/or methods are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units, modules, and/or methods being implemented by microprocessors or similar, they may be programmed using software (e.g., microcode) to perform various functions discussed herein and may optionally be driven by firmware and/or software. Alternatively, each block, unit, module, and/or method may be implemented by dedicated hardware, or as a combination of dedicated hardware to perform some functions and a processor (e.g., one or more programmed microprocessors and associated circuitry) to perform other functions. Also, each block, unit, and/or module of the embodiments may be physically separated into two or more interacting and discrete blocks, units and/or modules without departing from the scope of the disclosure. Further, the blocks, units and/or modules of the embodiments may be physically combined into more complex blocks, units and/or modules without departing from the scope of the disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of testing an interconnection substrate, the method comprising:
    setting a blocking condition to block reference light reflected from a probe having intrinsic optical characteristics;
    applying an electric field to the interconnection substrate;
    irradiating light onto the probe adjacent the interconnection substrate;
    blocking the reference light in reflected light from the probe in accordance with the blocking condition; and
    detecting a remainder of the reflected light.

2. The method as claimed in claim 1, wherein setting the blocking condition of the reference light includes:
    linearly polarizing light to form a first polarized light;
    phase shifting the first polarized light to form a second polarized light;
    irradiating the second polarized light onto the probe; and
    detecting the reference light reflected from the probe.

3. The method as claimed in claim 2, wherein linearly polarizing the light includes changing an azimuth of a linear polarizer for linearly polarizing the light.

4. The method as claimed in claim 2, wherein forming the second polarized light includes polarizing the first polarized light to provide the second polarized light with circular or elliptical polarization.

5. The method as claimed in claim 2, wherein forming the second polarized light includes changing an azimuth of a compensator phase shifting the first polarized light.

6. The method as claimed in claim 2, wherein detecting the reference light includes changing an azimuth of an analyzer blocking the reference light.

7. The method as claimed in claim 6, wherein detecting the reference light includes obtaining a complex amplitude of the light passing through the analyzer.

8. The method as claimed in claim 1, wherein irradiating the light to the probe adjacent the interconnection substrate includes:
    linearly polarizing the light to form a first polarized light;
    phase shifting the first polarized light to form a second polarized light; and
    irradiating the second polarized light onto the probe adjacent the interconnection substrate.

9. The method as claimed in claim 8, wherein irradiating the second polarized light includes irradiating the second polarized light onto a surface of the probe orthogonally to the surface.

10. The method as claimed in claim 8, wherein irradiating the second polarized light includes irradiating the second polarized light onto a surface of the probe at an angle.

11. The method as claimed in claim 8, wherein forming the second polarized light includes polarizing the first polarized light to provide the second polarized light with circular or elliptical polarization.

12. The method as claimed in claim 1, further comprising splitting the light into at least two lights beam to form an incident light incident on the probe.

13. The method as claimed in claim 1, further comprising:
    applying an electric field to a normal substrate;
    irradiating light onto the probe adjacent to the normal substrate;
    obtaining a normal image from light reflected from the probe adjacent to the normal substrate;
    obtaining a test image from light reflected from the probe adjacent the interconnection substrate; and
    comparing the test image with the normal image to determine whether circuits on the interconnection substrate are defective or not.

14. A method of testing an interconnection substrate, the method comprising:
    linearly polarizing light to form a first polarized light;
    phase shifting the first polarized light to form a second polarized light;
    irradiating the second polarized light onto a probe having intrinsic optical characteristics;
    detecting a reference light reflected from the probe having intrinsic optical characteristics;
    setting a blocking condition based on the reference light;
    applying an electric field to the interconnection substrate such that the probe adjacent the interconnection substrate has test optical characteristics;

irradiating additional second polarized light onto the probe adjacent the interconnection substrate;

blocking the reference light in reflected light from the probe having test optical characteristics in accordance with the blocking condition; and detecting a remainder of the reflected light.

15. The method as claimed in claim 14, wherein linearly polarizing the light includes changing an azimuth of a linear polarizer linearly polarizing the light.

16. The method as claimed in claim 14, wherein forming the second polarized light includes polarizing the first polarized light to provide the second polarized light with circular or elliptical polarization.

17. The method as claimed in claim 14, wherein forming the second polarized light includes changing an azimuth of a compensator phase shifting the first polarized light.

18. The method as claimed in claim 14, wherein detecting the reference light comprises changing an azimuth of an analyzer blocking the reference light.

19. The method as claimed in claim 14, further comprising splitting the light into at least two lights beam to form an incident light incident on the probe.

20. The method as claimed in claim 14, further comprising:

applying an electric field to a normal substrate such that the probe adjacent the normal substrate has normal optical characteristics, the additional second polarized light being irradiated onto the probe having normal optical characteristic;

obtaining a normal image from a light reflected from the probe having normal optical characteristics;

obtaining a test image from the remainder of light reflected from the probe having test optical characteristics; and comparing the test image with the normal image to determine whether circuits on the interconnection substrate are normal or not.

* * * * *